(12) United States Patent
Stokes

(10) Patent No.: US 9,772,147 B2
(45) Date of Patent: Sep. 26, 2017

(54) HEAT SINK MOUNTING APPARATUS AND METHOD

(71) Applicant: Vetco Gray Controls Limited, Bristol (GB)

(72) Inventor: Martin Stokes, Wales (GB)

(73) Assignee: GE Oil & Gas UK Limited, Nailsea, Bristol (GB)

( * ) Notice: Subject to any disclaimer, the term of this patent is extended or adjusted under 35 U.S.C. 154(b) by 464 days.

(21) Appl. No.: 14/365,887

(22) PCT Filed: Dec. 17, 2012

(86) PCT No.: PCT/EP2012/075848
§ 371 (c)(1),
(2) Date: Jun. 16, 2014

(87) PCT Pub. No.: WO2013/087938
PCT Pub. Date: Jun. 20, 2013

(65) Prior Publication Data
US 2014/0305623 A1    Oct. 16, 2014

(30) Foreign Application Priority Data
Dec. 16, 2011   (EP) .................................... 11193976

(51) Int. Cl.
*F28F 9/007* (2006.01)
*H05K 7/20* (2006.01)

(52) U.S. Cl.
CPC ............... *F28F 9/007* (2013.01); *H05K 7/20* (2013.01); *H05K 7/20545* (2013.01); *Y10T 29/49945* (2015.01)

(58) Field of Classification Search
CPC ............... F28F 2275/10; F28F 2275/14; F28F 2275/143; F28F 9/007; H05K 7/1007; H05K 7/20; H05K 7/20545
USPC .................................... 165/67, 76, 80.3, 185
See application file for complete search history.

(56) References Cited

U.S. PATENT DOCUMENTS

| 4,096,547 A | 6/1978 | Calabro |
| 4,246,597 A * | 1/1981 | Cole ................... H01L 23/3675 165/185 |
| 4,607,277 A * | 8/1986 | Hassan ............... H01L 23/4338 257/713 |

(Continued)

FOREIGN PATENT DOCUMENTS

| DE | 3245072 A1 | 6/1984 |
| DE | 3830376 A1 | 3/1990 |

(Continued)

OTHER PUBLICATIONS

European Search Report and Written Opinion dated May 22, 2012 with was issued in connection with the European Patent Application No. 11193976 which was filed on Dec. 16, 2011.

(Continued)

*Primary Examiner* — Tho V Duong
(74) *Attorney, Agent, or Firm* — GE Global Patent Operation

(57) ABSTRACT

A heat sink mounting apparatus including: a heat sink; and a device housing, the housing having a slot in the wall of the housing configured to receive a heat sink, wherein the heat sink and the housing are configured such that the heat sink can be secured within the slot with an interference fit.

13 Claims, 2 Drawing Sheets

(56) References Cited

U.S. PATENT DOCUMENTS

| | | | | | |
|---|---|---|---|---|---|
| 4,625,260 | A | * | 11/1986 | Jordan | H01L 23/4093 228/180.21 |
| 4,707,726 | A | * | 11/1987 | Tinder | H01L 23/4006 165/80.1 |
| 4,908,695 | A | * | 3/1990 | Morihara | H01L 23/4338 257/719 |
| 5,038,858 | A | * | 8/1991 | Jordan | H01L 23/3672 165/185 |
| 5,138,524 | A | * | 8/1992 | Smithers | H01L 23/4093 174/16.3 |
| 7,249,957 | B2 | | 7/2007 | Watanabe et al. | |
| 2005/0103470 | A1 | * | 5/2005 | Mathews | H01L 21/4882 165/80.3 |

FOREIGN PATENT DOCUMENTS

| | | |
|---|---|---|
| EP | 0662733 | 7/1996 |
| EP | 0833406 | 4/1998 |
| EP | 2131639 A2 | 12/2009 |
| WO | 2008114444 A1 | 9/2008 |

OTHER PUBLICATIONS

International Search Report and Written Opinion dated Mar. 27, 2013 with was issued in connection with the PCT Patent Application No. PCT/EP12/075848 which was filed on Dec. 17, 2012.

* cited by examiner

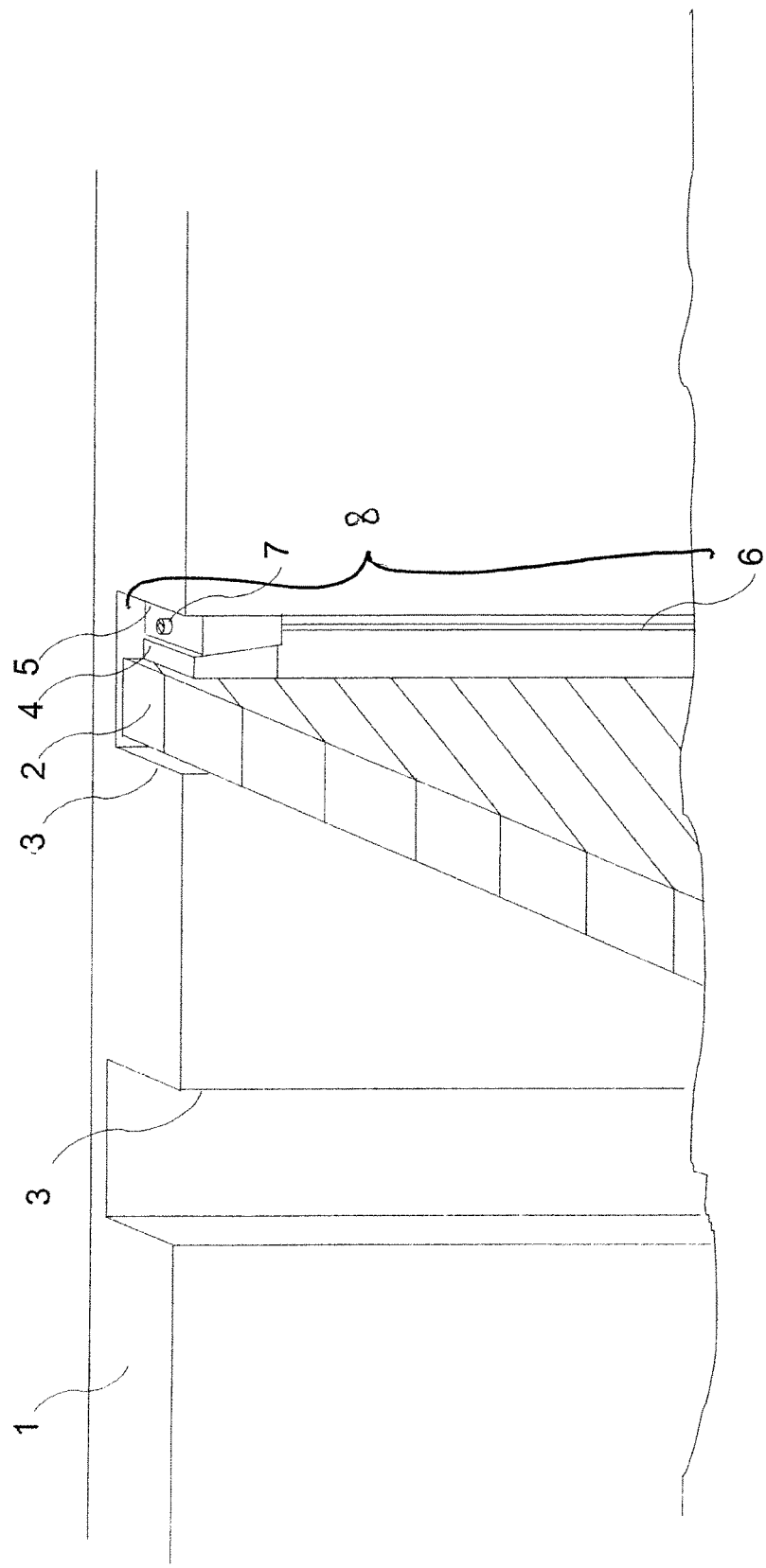

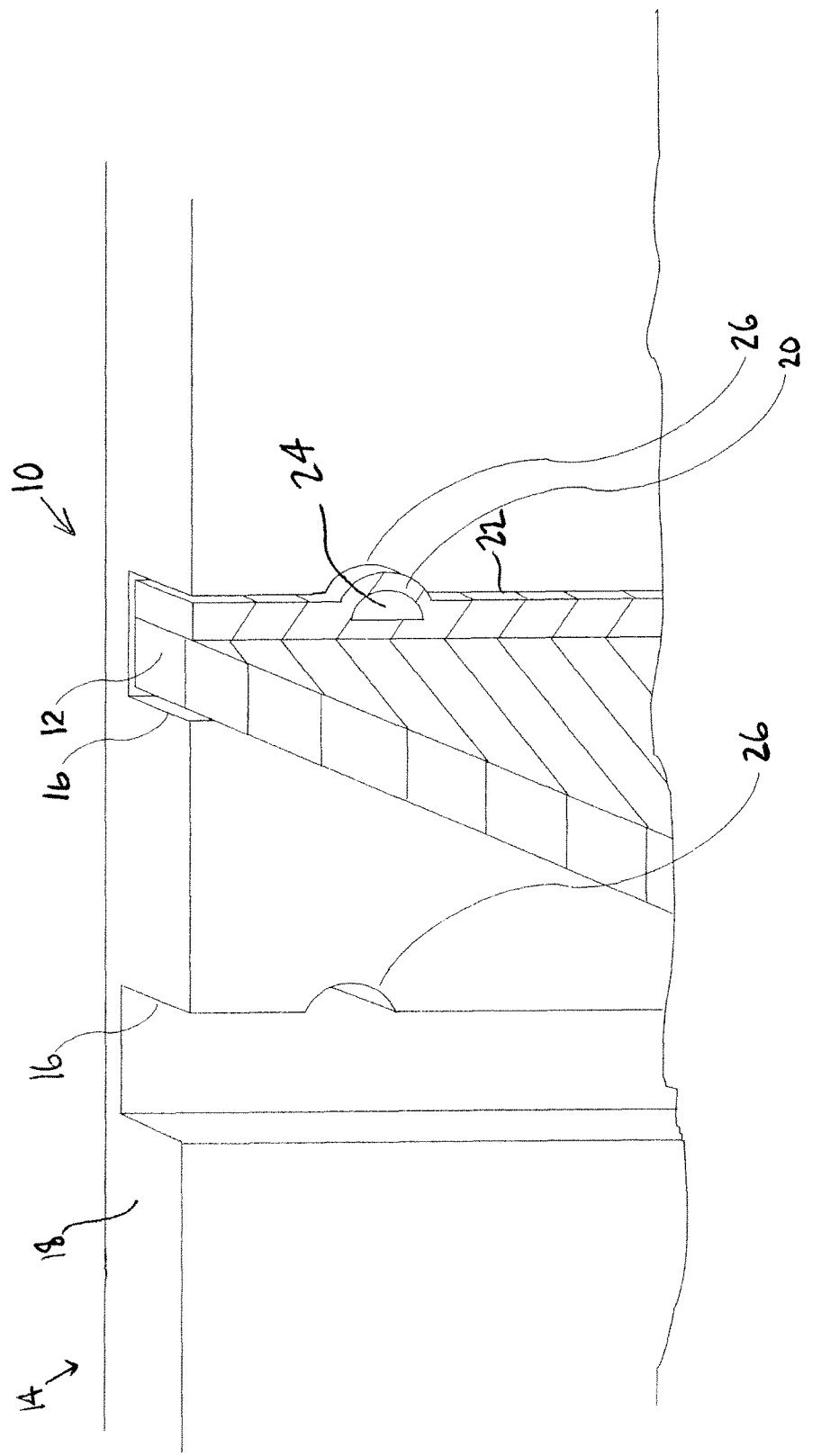

HEAT SINK MOUNTING APPARATUS AND METHOD

FIELD OF THE INVENTION

Embodiments of the present invention relate to a heat sink mounting apparatus and method, for example a heat sink mounting apparatus and method for a use with a subsea electronics module for a subsea control module as part of a well control system, such as a control system for a subsea well.

BACKGROUND OF THE INVENTION

It is well-known to use heat sinks as cooling devices to transfer away heat generated in electronic components. As illustrated in FIG. 1, removal of heat from a high power electronic component housed within a device housing 1, is typically achieved by mounting the electronic component on a metal plate heat sink 2 (shown as hatched for clarity), which is generally formed from an aluminium alloy. The electronic component is omitted for clarity, but it can be attached to the heat sink 2 by a variety of well-known methods. The heat sink 2 is in turn attached to the wall of the device housing 1, thus providing a good thermal conduction path from the electronic component to the device housing 1, which then dissipates the heat to the surrounding environment by conduction and/or radiation.

Typically such heat sinks 2 need to be removable from the device housing 1 to facilitate replacement and repair. As shown in FIG. 1, the heat sink 2 is typically secured in the device housing 1 by clamping the heat sink 2 within a slot 3 in the container wall by a screw and wedge device, known commercially as a wedgelock 8. A further empty slot 3 is shown adjacent to the slot 3 to aid understanding, but in practice more than one heat sink 2 may be attached to the device housing 1.

The wedgelock 8 consists of an assembly of a pair of wedges 4, 5 at the top of the slot 3 in the wall of the device housing 3 and a further pair of wedges at the bottom of the slot (not shown, only the top section of the housing being shown for clarity). The top and bottom pairs of wedges are connected by a screwed rod 6, capped with a slotted head 7. Typically the edge of the heat sink 2 is machined to accommodate the wedgelock 8. Rotation of the screwed rod 6 causes wedge 5, and its corresponding wedge at the bottom, to move relative to the other wedge 4 of the pair. Movement of wedge 5, and its corresponding wedge at the bottom, causes the wedges 4, 5 to exert a force against the heat sink 2 and clamp the heat sink 2 to the side of the slot 3 in the wall of the device housing 1. The wedgelock 8 is glued to the heat sink 2 edge. Although wedgelocks 8 generally function satisfactorily in securing heat sinks 2 to device housings, they are expensive to manufacture and the gluing process is time consuming.

SUMMARY OF THE INVENTION

According to a first aspect of the present invention there is provided a heat sink mounting apparatus for mounting a heat sink to a wall of a device housing, the apparatus comprising: a heat sink; and a device housing, the housing having a slot in a wall of the housing for receiving a heat sink, wherein the heat sink and the housing are adapted such that the heat sink can be secured within the slot with an interference fit.

The use of an interference fit to secure the heat sink to the device housing eliminates the need to use wedgelocks and glue, thus significantly reducing the costs and time associated with securing the heat sink in the device housing.

In an embodiment of the invention the heat sink comprises an elongate protrusion which is arranged to be received in a corresponding groove in the slot in the wall of the housing. The interaction of the protrusion and the groove help to achieve the interference fit. The protrusion will have sufficient flexibility to permit it to be press fitted into the groove.

In an embodiment of the invention a hollow channel is provided within the protrusion. The hollow channel serves to facilitate temporary distortion of the protrusion as the heat sink is fitted into the device housing.

In an embodiment of the invention the protrusion has a curved upper surface. In an embodiment of the invention the protrusion is dome-shaped in cross-section.

In an embodiment of the invention the hollow channel has generally the same shape as the protrusion.

In an embodiment of the invention the heat sink is machined from a solid block. In an embodiment of the invention the heat sink is formed from aluminium alloy.

In an embodiment of the invention a plurality of protrusions are provided in the heat sink for engaging with a plurality of corresponding grooves in the slot in the wall of the housing.

In an embodiment of the invention a plurality of heat sinks are provided for engaging with a plurality of slots in a wall of the housing.

In an embodiment of the invention the housing is a housing of a subsea electronics module for a subsea control module of a control system for a subsea well.

According to a second aspect of the present invention there is provided a method of mounting a heat sink to a wall of a device housing, the housing having a slot in a wall of the housing for receiving the heat sink, the heat sink and the housing being adapted such that the heat sink can be secured within the slot with an interference fit, the method comprising the steps of: aligning the heat sink with the slot in the wall of the housing; and applying a force to heat sink in the direction of the slot such that at least a portion of the heat sink is received within the slot.

In an embodiment of the invention the heat sink comprises an elongate protrusion which is arranged to be received in a corresponding groove in the slot in the wall of the housing, and the force applied is sufficient to cause a temporary distortion of the protrusion.

BRIEF DESCRIPTION OF THE DRAWINGS

The present invention will now be described, purely by way of example, with reference to the accompanying drawings, in which:

FIG. 1 shows a partial perspective view of a prior art heat sink mounting apparatus; and FIG. 2 shows a partial perspective view of a heat sink mounting apparatus according to an embodiment of the present invention.

DETAILED DESCRIPTION OF THE INVENTION

FIG. 1 shows a prior art heat sink mounting apparatus as described above.

FIG. 2 shows a heat sink mounting apparatus 10 according to an embodiment of the present invention, for example for the securing of heat sinks in a subsea electronics module (SEM) housed within a subsea control module (SCM) mounted, for example, on a subsea well tree, as part of the well control system for a subsea well, such as a hydrocarbon production well.

The heat sink mounting apparatus 10 comprises a heat sink 12 and a device housing 14, such as a housing of a SEM. The device housing 14 has a slot 16 in a wall 18 of the housing 14 for receiving the heat sink 12. The heat sink 12 (shown as hatched for clarity) is provided to remove the heat from an electronic component, and is typically machined from a solid block, as it is often not a simple plate and box construction with edges machined to suit a wedgelock, as in the prior art. The electronic component is omitted from FIG. 2 for clarity, but it can be attached to the heat sink 12 by a variety of well-known methods. The heat sink 12 is typically machined from a solid block of aluminium alloy using a CNC machine. The heat sink 12 has an elongate protrusion 20 machined along a side edge 22 of the heat sink 12. The elongate protrusion 20 has a curved upper surface which is dome-shaped in cross-section. To facilitate the temporary distortion of the protrusion 20, which will be described in more detail below, a hollow channel 24 is machined in the protrusion 20. The shape of the hollow channel 24 matches the shape of the protrusion, but in practice any shape of channel, even a simple hole, will often suffice.

The slot 16, in the wall 18 of the device housing 14, is also machined with a "female" groove 26, to match the "male" half of the protrusion 20, on the heat sink 12. An adjacent unoccupied slot 16 is shown to further illustrate the groove 26. Insertion of the heat sink 12 (with attached electronic component) into the housing is achieved by sliding the heat sink 12 into the slot 16, until the protrusion 20 engages with the groove 26 in the slot 16. Once the protrusion 20 comes into contact with the groove 26 in the slot 16 substantial pressure must be applied to temporarily distort the protrusion 20 to complete the insertion of the heat sink 12 into the groove 26. The hollow channel 24 serves to facilitate temporary distortion of the protrusion 20 as the heat sink 12 is fitted into the device housing 14.

The tolerances of the protrusion 20 and the groove 26 are arranged such that on completion of the insertion of the heat sink 12, the protrusion 20 of the heat sink 12 is still slightly in compression, thus ensuring a firm pressure and good thermal conduction of the heat sink 12 to the slot 26. To ensure consistent pressure across the slot 16, protrusions 20 are, typically, machined at the top and bottom of the heat sink 12, and the slots 16. In order to extract the heat sink 12, and the attached electronic component, from the device housing 14 a simple extraction tool may be necessary, or the end of the heat sink 12 may be machined to allow a screwdriver to be inserted to lever the heat sink 12 out of its slot 16.

A key advantage of the present invention is the elimination of expensive wedge locking devices and the gluing process to attach them, in exchange for the low additional cost of machining the protrusion in the heat sink 12 and the corresponding groove 26 in the wall 18 of the device housing 14.

The invention claimed is:

1. A heat sink mounting apparatus comprising:
a heat sink, the heat sink comprising an elongate protrusion; and
a device housing, the device housing having a slot in a wall of the device housing configured to receive the heat sink,
wherein the heat sink and the device housing are configured to secure the heat sink within the slot with an interference fit,
wherein the elongate protrusion is configured to be received in a corresponding groove in the slot in the wall of the device housing, and
wherein the elongate protrusion comprises a hollow channel machined therein to facilitate a temporary distortion of the elongate protrusion during insertion of the heat sink within the slot in the wall of the device housing.

2. The heat sink mounting apparatus according to claim 1, wherein the elongate protrusion comprises a curved surface.

3. The heat sink mounting apparatus according to claim 2, wherein the elongate protrusion is dome-shaped in cross-section.

4. The heat sink mounting apparatus according to claim 1, wherein the hollow channel comprises generally the same shape as the elongate protrusion.

5. The heat sink mounting apparatus according to claim 1, wherein the elongate protrusion is capable of the temporary distortion under pressure.

6. The heat sink mounting apparatus according to claim 1, wherein the heat sink is machined from a solid block.

7. The heat sink mounting apparatus according to claim 1, wherein the heat sink is formed from aluminium alloy.

8. The heat sink mounting apparatus according to claim 1, wherein a plurality of elongate protrusions comprise a respective hollow channel and are provided on the heat sink for engaging with a plurality of corresponding grooves in the slot in the wall of the device housing.

9. The heat sink mounting apparatus according to claim 1, comprising a plurality of heat sinks for engaging with a plurality of slots in the wall of the device housing.

10. The heat sink mounting apparatus according to claim 1, wherein the device housing is a housing of a subsea electronics module for a subsea control module of a control system for a subsea well.

11. A method of mounting a heat sink to a wall of a device housing, the device housing having a slot in the wall of the device housing configured to receive the heat sink, the heat sink and the device housing configured such that the heat sink can be secured within the slot with an interference fit, the method comprising the steps of:
aligning the heat sink with the slot in the wall of the device housing; and
applying a force to the heat sink in the direction of the slot such that at least a portion of the heat sink is received within the slot,
wherein the heat sink comprises an elongate protrusion, the elongate protrusion comprising a hollow channel machined therein to facilitate a temporary distortion of the elongate protrusion during insertion of the heat sink within the slot in the wall of the device housing,
wherein the elongate protrusion is configured to be received in a corresponding groove in the slot in the wall of the device housing, and
wherein the force applied is sufficient to cause the temporary distortion of the elongate protrusion.

12. The heat sink mounting apparatus according to claim 1, wherein the elongate protrusion is machined on a side edge of the heat sink.

13. The method according to claim 11, wherein the elongate protrusion is machined on a side edge of the heat sink.

* * * * *